(12) United States Patent
Usami

(10) Patent No.: US 8,293,637 B2
(45) Date of Patent: Oct. 23, 2012

(54) SEMICONDUCTOR DEVICE AND METHOD OF MANUFACTURING THE SAME

(75) Inventor: Tatsuya Usami, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/064,940

(22) Filed: Apr. 27, 2011

(65) Prior Publication Data

US 2011/0207318 A1   Aug. 25, 2011

Related U.S. Application Data

(62) Division of application No. 12/591,193, filed on Nov. 12, 2009, now Pat. No. 7,956,467.

(30) Foreign Application Priority Data

Nov. 13, 2008   (JP) ................................. 2008-290977

(51) Int. Cl.
*H01L 21/00*   (2006.01)

(52) U.S. Cl. .......................... 438/629; 438/643; 438/653

(58) Field of Classification Search .................. 438/629, 438/643, 653
See application file for complete search history.

(56) References Cited

U.S. PATENT DOCUMENTS

| 7,531,891 B2 | 5/2009 | Ohto et al. |
| 7,956,467 B2* | 6/2011 | Usami ........................... 257/760 |
| 8,105,935 B2 | 1/2012 | Ohara et al. |
| 2004/0076767 A1 | 4/2004 | Satoh et al. |
| 2004/0115876 A1 | 6/2004 | Goundar et al. |

FOREIGN PATENT DOCUMENTS

| JP | 2002-203899 | 7/2002 |
| JP | 2003-31580 A | 1/2003 |
| JP | 2005-223012 A | 8/2005 |
| JP | 2008-235480 A | 10/2008 |

OTHER PUBLICATIONS

Notice of Reason for Rejection dated Apr. 17, 2012, with English translation.

* cited by examiner

*Primary Examiner* — Richard A. Booth
(74) *Attorney, Agent, or Firm* — McGinn IP Law Group, PLLC

(57) ABSTRACT

A method of manufacturing a semiconductor device, includes burying a conductive pattern in an insulating film made of SiOH, SiCOH or organic polymer, treating surfaces of the insulating film and the conductive pattern with plasma which includes a hydrocarbon gas as a treatment gas, and forming a diffusion barrier film, which is formed of an SiCH film, an SiCHN film, an SiCHO film or an SiCHON film, over the insulating film and the conductive pattern with performing a plasma CVD by adding an Si-containing gas to the treatment gas while increasing the addition amount gradually or in a step-by-step manner.

8 Claims, 5 Drawing Sheets

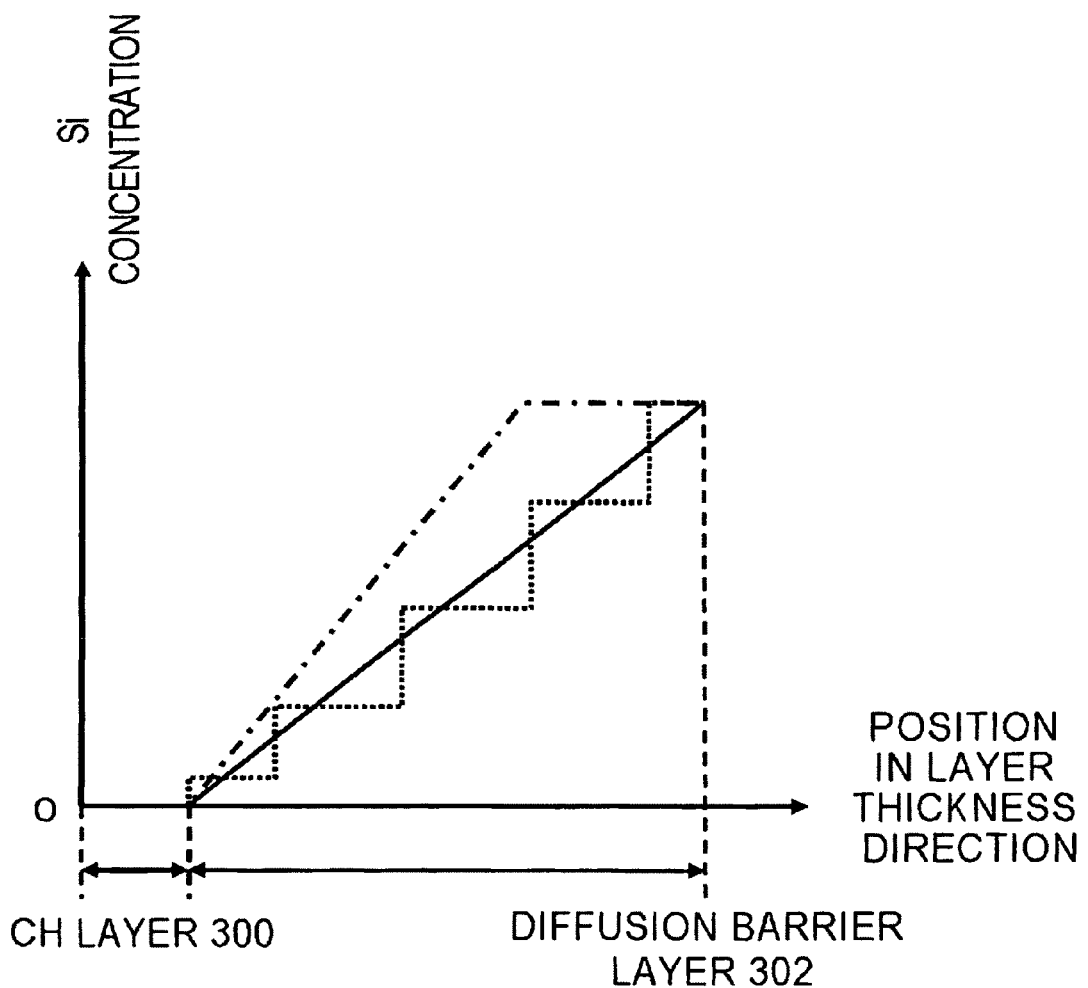

SEMICONDUCTOR DEVICE AND METHOD OF MANUFACTURING THE SAME

The present Application is a Divisional Application of U.S. patent application Ser. No. 12/591,193, filed on Nov. 12, 2009 now U.S. Pat. No. 7,956,467, which is based on Japanese patent application No. 2008-290977, filed on Nov. 13, 2008, the entire contents of which is incorporated herein by reference.

BACKGROUND

1. Technical Field

The present invention relates to a semiconductor device including a diffusion barrier film formed over an insulating film and a conductive pattern, and a method of manufacturing the same.

2. Related Art

In recent years, copper has been used as interconnect material for semiconductor devices. Copper interconnect is formed in the form of being buried in an insulating film.

When copper is used as interconnect material for semiconductor devices, a diffusion barrier film is required to be formed over the copper interconnect in order to prevent the copper from being diffused to an upper layer of the copper interconnect. When the diffusion barrier film is formed over the copper interconnect, it is necessary to secure adhesion between the copper interconnect and the diffusion barrier film and adhesion between the insulating film in which the copper interconnect is buried and the diffusion barrier film.

Japanese Laid-open patent publication NO. 2002-203899 discloses a technique for exposing a copper layer to reducing plasma and carbon-containing plasma before forming an inorganic barrier film over the copper layer in order to improve adhesion between the inorganic barrier film and the copper layer.

With miniaturization of semiconductor devices, there is a need to reduce inter-interconnect capacitance. Lowering of a relative permittivity of an insulating film in which an interconnect is buried is effective in reducing the inter-interconnect capacitance. An example of the insulating film having a low relative permittivity may include an SiOH film, an SiCOH film or an organic polymer film. The present inventor has recognized as follows. A process of burying a conductive pattern such as a copper pattern or the like in the insulating film includes a chemical mechanical polishing (CMP) process. In the CMP process, since the conductive pattern is physically polished while being oxidized, an oxide layer is left on a surface layer of the conductive pattern after the CMP process. This residual oxide layer deteriorates an electromigration characteristic of the conductive pattern. In addition, when an SiOH film, an SiCOH film or an organic polymer film is used as the insulating film, a surface layer of the insulating film is oxidized in the CMP process and its relative permittivity is raised.

It may be contemplated that a surface layer of the copper pattern is exposed to a reducing atmosphere as a method of eliminating the oxide layer on the surface layer of the conductive pattern. However, the present inventor has studied this method and has found that this method exposes a surface layer of the insulating film to the reducing atmosphere, thereby further raising the relative permittivity of the surface layer of the insulating film.

Another finding of the studies of the present inventor is that, when the relative permittivity of the surface layer of the insulating film is raised, it was revealed that the relative permittivity of the surface layer of the insulating film is lowered if the surface layer of the insulating film is treated by plasma of carbon-containing gas. However, it was also revealed that adhesion between the insulating film and a diffusion barrier film is lowered if the surface layer of the insulating film is treated by carbon-containing plasma.

In this manner, when the SiOH, SiCOH or organic polymer is used as the insulating film, it is difficult to prevent the oxide layer from being left on the surface layer of the conductive pattern, prevent the relative permittivity of the surface layer of the insulating film from being raised, and prevent the adhesion between the insulating film and the diffusion barrier film from being lowered.

SUMMARY

In one embodiment, there is provided a method of manufacturing a semiconductor device, including: burying a conductive pattern in an insulating film made of SiOH, SiCOH or organic polymer; treating surfaces of the insulating film and the conductive pattern with plasma which includes a hydrocarbon gas as a treatment gas; and forming a diffusion barrier film, which is formed of an SiCH film, an SiCHN film, an SiCHO film or an SiCHON film, over the insulating film and the conductive pattern with performing a plasma CVD by adding an Si-containing gas to the treatment gas while increasing the addition amount gradually or in a step by step manner.

According to the method of manufacturing a semiconductor device, in the surface treating step, activated hydrogen can be supplied to the surface layer of the conductive pattern. Accordingly, even when an oxide layer is formed on the surface layer of the conductive pattern in the burying step, the oxide layer can be reduced in the surface treating step. In addition, in the surface treating step, a deterioration layer formed on the surface layer of the insulating film can be modified by activated carbon. Accordingly, even when a relative permittivity of the surface layer of the insulating film is raised in the burying step, the relative permittivity of the surface layer of the insulating film can be lowered. In addition, in the surface treating step, a CH film or a CHN film may be formed over the insulating film and the conductive pattern.

In the meantime, in the film forming step, the Si-containing gas is added to the treatment gas including the hydrocarbon gas while increasing the addition amount gradually or in a step by step manner. Accordingly, the diffusion barrier film has an Si concentration which increases gradually or in a step by step manner in an upward direction. Accordingly, even when the CH film or the CHN film is formed over the insulating film and the conductive pattern in the surface treating step, it is possible to prevent adhesion between the CH film or the CHN film and the diffusion barrier film from being lowered.

In this manner, according to the present invention, even when the SiOH, SiCOH or organic polymer is used as the insulating film, it is possible to prevent an oxide layer from being left on the surface layer of the conductive pattern, prevent the relative permittivity of the surface layer of the insulating film from being raised, and prevent adhesion between the insulating film and the diffusion barrier film from being lowered.

In another embodiment, there is provided a semiconductor device including: an insulating film made of SiOH, SiCOH or organic polymer; a conductive pattern buried in the insulating film; and a diffusion barrier film which is located over the insulating film and the conductive pattern and is formed of an SiCH film, an SiCHN film, an SiCHO film or an SiCHON film. The diffusion barrier film includes an Si concentration which increases in an upward direction gradually or in a step by step manner.

According to the present invention, even when the SiOH, SiCOH or organic polymer is used as the insulating film, it is possible to prevent an oxide layer from being left on the surface layer of the conductive pattern, prevent the relative permittivity of the surface layer of the insulating film from being raised, and prevent adhesion between the insulating film and the diffusion barrier film from being lowered.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 3 is a graph schematically showing a dependency of an Si concentration in a film thickness direction in a laminated film (or continuous film) including a CH film and a diffusion barrier film;

DETAILED DESCRIPTION OF PREFERRED EMBODIMENTS

Figure 1A:
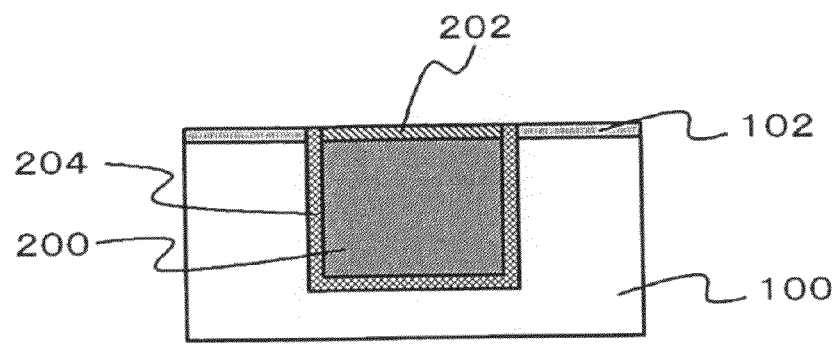
FIGS. 1A and 1B are sectional views showing a method of manufacturing a semiconductor device according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, exemplary embodiments of the present invention will be described with reference to the accompanying drawings. Throughout the drawings, like elements are denoted by like reference numerals and explanation thereof will not be repeated.

FIGS. 1A, 1B, 2A and 2B are sectional views showing a method of manufacturing a semiconductor device according to a first embodiment. This method of manufacturing a semiconductor device includes a burying process, a first surface treating process and a film forming process. The burying process is a process of burying a conductive pattern 200 in an insulating film 100 made of SiOH, SiCOH or organic polymer. The first surface treating process is a process of treating surfaces of the insulating film 100 and the conductive pattern 200 with plasma with a treatment gas which includes a hydrocarbon gas. The film forming process is a process of forming a diffusion barrier film 302 formed of an SiCH film, SiCHN film, SiCHO film or SiCHON film over the insulating film 100 and the conductive pattern 200 using a plasma CVD by adding an Si-containing gas to the treatment gas while increasing the addition amount gradually or in a step by step manner. Hereinafter, these processes will be described in detail.

As shown in FIG. 1A, first, the insulating film 100 made of SiOH, SiCOH or organic polymer is formed. The insulating film 100 may be a porous film having a plurality of holes (whose diameter is for example equal to or less than 10 nm). A relative permittivity of the insulating film is equal to or less than 2.7. "Silk" (trade mark, available from The Dow Chemical Co.) may be used as the organic polymer of which the insulating film 100 is formed. Next, a silicon oxide film (not shown) is formed over the insulating film 100, and then the silicon oxide film and the insulating film 100 are selectively etched. Thus, a groove is formed in the insulating film 100.

Next, a diffusion barrier film 204 is formed in the groove and over the silicon oxide film on the insulating film 100 using, for example, a sputtering process. The diffusion barrier film 204 is for example a tantalum film. Next, a conductive film is formed over the diffusion barrier film 204 by, for example, carrying out formation of a seed film (for example, a Cu seed film) by a sputtering process and electroplating in this order, and additionally, the conductive film, the diffusion barrier film 204 and the silicon oxide film located over the insulating film 100 are removed by a CMP process. Thus, the diffusion barrier film 204 and the conductive pattern 200 are buried in the insulating film 100. The conductive pattern 200 is, for example, copper interconnect. When the conductive pattern 200 is copper interconnect, adjacent copper interconnects are for example equal to or less than 75 nm in their mutual intervals and equal to or less than 150 nm in a distance between their centers.

In the CMP process, an oxide layer 202 (for example a CuO layer) is formed on a surface layer of the conductive pattern 200. In addition, since a surface layer of the insulating film 100 is polished by the CMP process, a deterioration layer 102 with a high relative permittivity is also formed on the surface layer of the insulating film 100. If the insulating film 100 is an SiCOH film, the deterioration layer 102 is for example formed when a methyl group of the surface layer of the SiCOH film is destroyed to generate an Si-OH bond or a dangling bond of Si. If the insulating film 100 is an SiOH layer, the deterioration layer 102 is for example formed when a dangling bond of Si is generated.

If the insulating film 100 is an organic polymer layer, the deterioration layer 102 is nearly sublimated, with a dangling bond of C left on a surface layer of the organic polymer layer.

Figure 1B:
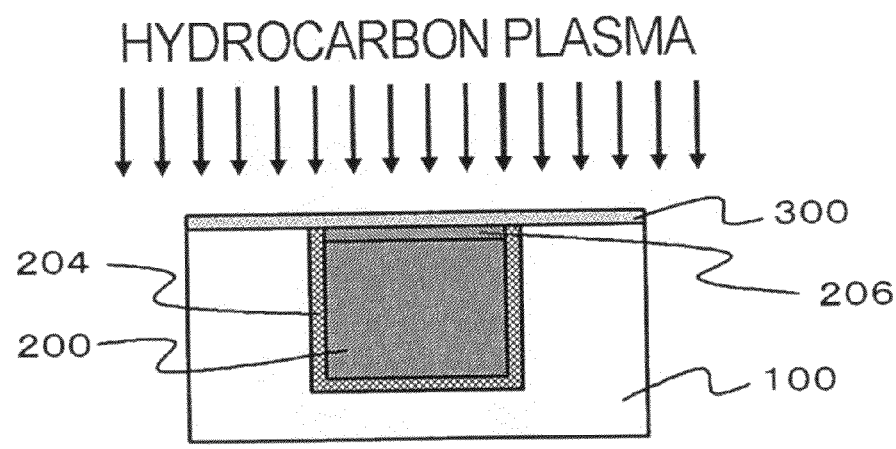

Next, as shown in FIG. 1B, the surface of the insulating film 100 and the surface of the conductive pattern 200 are treated by plasma with a treatment gas which includes a hydrocarbon gas. The hydrocarbon gas is for example ethene (ethylene) but may be any of other hydrocarbon gases (for example $CH_4$, $C_2H_4$ or the like). In addition, the treatment gas may be a 100% hydrocarbon gas or may contain He of equal to or more than 50 Vol % and equal to or less than 99 Vol %, which is a carrier gas, in addition to the hydrocarbon gas.

The plasma contains activated hydrogen (hydrogen ions, hydrogen radicals or the like) and activated carbon (carbon ions, carbon radicals or the like). Accordingly, since the oxide layer 202 formed on the surface layer of the conductive pattern 200 is reduced by the activated hydrogen and carbon is introduced in the oxide layer 202, the oxide layer 202 becomes a carbon-containing Cu layer 206. In addition, the Si—OH bond or the Si dangling bond of the deterioration layer 102 formed on the surface layer of the insulating film 100 is turned to an Si—CH bond by the activated carbon and hydrogen, thereby modifying the deterioration layer 102.

In addition, in this process, a CH film 300 may be formed on the surface of the insulating film 100 and the surface of the conductive pattern 200. The thickness of the CH film 300 is for example equal to or more than 1 nm and equal to or less than 10 nm. In the CH film 300, C is for example equal to or less than 25% by the number of atoms with respect to H. In addition, C is introduced in the surface layer of the conductive pattern 200.

Figure 2A:
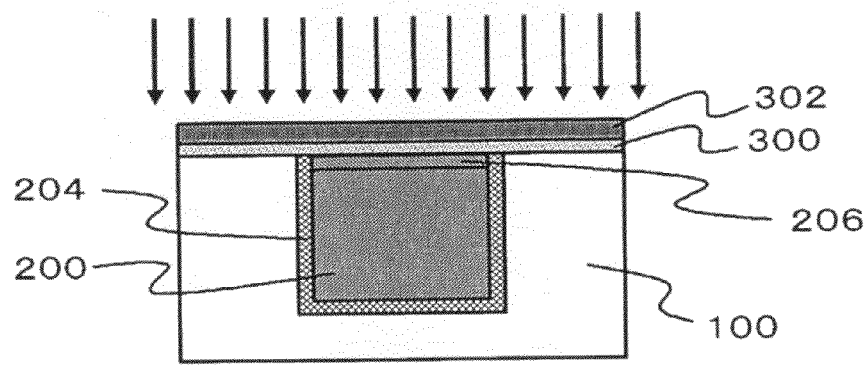
FIGS. 2A and 2B are sectional views showing a method of manufacturing a semiconductor device according to the first embodiment.
Figure 2B:
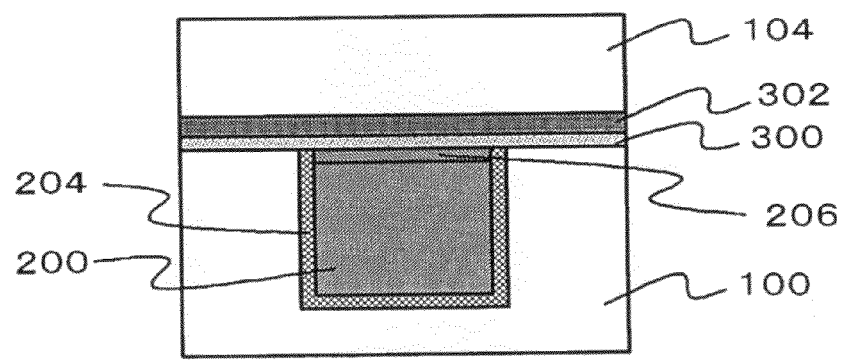

Next, as shown in FIG. 2A, a plasma CVD is performed by adding an Si-containing gas to the treatment gas while increasing the addition amount gradually or in a step by step manner. An example of the Si-containing gas may include a trimethylsilane gas or other gases (for example tetramethylsilane, dimethylsilane, monomethylsilane, tetravinylsilane, trivinylmonomethylsilane, trimethylsilane, divinylsilane, divinyldimethylsilane, monovinyltrimethylsilane, monovinylsilane, monosilane, trimethylphenylsilane, dimethyldiphenylsilane, phenylsilane, diphenoldisilane, or the like.). In addition, when the Si-containing gas is added, the plasma may be dropped once or may remain unchanged. Accordingly, a diffusion barrier film 302, which is an SiCH film, an SiCHN film, an SiCHO film or an SiCHON film, is formed over the CH film 300. When the addition of the Si-containing gas is started maintaining the plasma, the diffusion barrier film 302 is formed to be continued to the CH film 300. The thickness of the diffusion barrier film 302 is for example equal to or more than 5 nm and equal to or less than 50 nm. The Si concentration of the diffusion barrier film 302 increases in an upward direction gradually or in a step by step manner. The Si concentration in the diffusion barrier film 302 is for example equal to or more than 5 atomic % and equal to or less than 30 atomic % on average. Next, as shown in FIG. 2B, an insulating film 104 is formed over the diffusion barrier film 302. The insulating film 104 is for example an interlayer insulating film and is for example made of SiOH, SiCOH or organic polymer. The insulating film 104 may be a porous film and may have a relative permittivity of equal to or less than 2.7.

The semiconductor device formed in this manner has the insulating film 100, the conductive pattern 200 and the diffusion barrier film 302. The conductive pattern 200 is buried in the insulating film 100 and the diffusion barrier film 302 is located over the insulating film 100 and the conductive pattern 200. The diffusion barrier film 302 has the Si concentration which increases in the upward direction gradually or in a step by step manner. In addition, the CH film 300 is interposed between the insulating film 100 and the conductive pattern 200, and the diffusion barrier film 302.

FIG. 3 is a graph schematically showing a dependency of the Si concentration in a film thickness direction in a laminated film (or continuous film) including the CH film 300 and the diffusion barrier film 302. No Si is contained in the CH film 300. Almost no Si is contained in the diffusion barrier film 302 at an interface with the CH film 300. The diffusion barrier film 302 has the Si concentration which increases gradually or in a step by step manner as it becomes distant from the interface with the CH film 300 (that is, in a positive film thickness direction).

Next, the operation and effect of this embodiment will be described. This embodiment has the process of treating the surfaces of the insulating film 100 and conductive pattern 200 with the plasma with the treatment gas including the hydrocarbon gas. Accordingly, the oxide layer 202 formed on the surface layer of the conductive pattern 200 is reduced by the activated hydrogen.

The Si—OH bond or the Si dangling bond of the deterioration layer 102 formed on the surface layer of the insulating film 100 is turned to the Si—CH bond by the activated carbon and hydrogen. Accordingly, the deterioration layer 102 is modified. Accordingly, it is possible to prevent the relative permittivity of the surface layer of the insulating film 100 from being raised. In addition, when a plurality of conductive patterns 200 is formed in the insulating film 100, it is possible to prevent a time dependent dielectric breakdown (TDDB) characteristic between these conductive patterns 200 from being deteriorated.

In addition, in the process of forming the diffusion barrier film 302, the Si-containing gas is added to the treatment gas including the hydrocarbon gas while increasing the addition amount gradually or in a step by step manner. As a result, the diffusion barrier film 302 has the Si concentration which increases in the upward direction gradually or in a step by step manner. Accordingly, even when the CH film 300 is formed on the surfaces of the insulating film 100 and conductive pattern 200, it is possible to prevent the adhesion between the insulating film 100 and the diffusion barrier film 302 from being lowered. In this manner, according to this embodiment, when the insulating film 100 is made of the SiOH, SiCOH or organic polymer, it is possible to prevent an oxide layer from being left on the surface layer of the conductive pattern 200, prevent the relative permittivity of the surface layer of the insulating film 100 from being raised, and prevent the adhesion between the insulating film 100 and the diffusion barrier film 302 from being lowered. Accordingly, the reliability of the semiconductor device is improved. This effect is particularly noticeable when the diffusion barrier film 302 is formed to be continued to the CH film 300.

If the adhesion between the insulating film 100 and the diffusion barrier film 302 is lowered, water may penetrate into through a gap between the insulating film 100 and the diffusion barrier film 302. If the insulating film 100 is a porous film, the insulating film 100 absorbs the water, thereby decreasing a breakdown voltage of the insulating film 100 and increasing an inter-interconnect capacitance in the same layer as the insulating film 100. As described above, according to this embodiment, since the adhesion between the insulating film 100 and the diffusion barrier film 302 can be prevented from being lowered, it is possible to prevent such a problem from occurring.

In addition, since C is introduced in the surface layer of the conductive pattern 200, even when oxygen is diffused into the surface of the conductive pattern 200, the oxygen preferentially reacts with the carbon, thereby preventing an oxide layer from being formed on the surface layer of the conductive pattern 200. Accordingly, an electro-migration of the conductive pattern 200 is improved.

Figure 4:
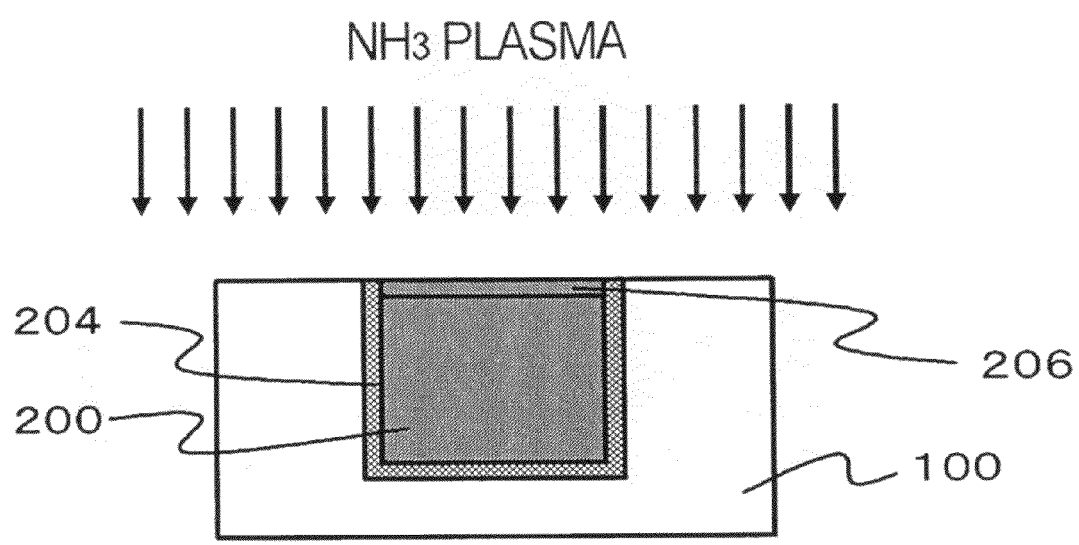
FIG. 4 is a sectional view showing a method of manufacturing a semiconductor device according to a second embodiment.

FIG. 4 is a sectional view showing a method of manufacturing a semiconductor device according to a second embodiment. The method of manufacturing a semiconductor device according to this embodiment has the same processes as those of the first embodiment except that the former includes a second surface treating process between the burying process of burying the conductive pattern 200 in the insulating film 100 and the first surface treating process of treating the surfaces of the insulating film 100 and conductive pattern 200 with the plasma with the treatment gas including the hydrocarbon gas. The second surface treating process is a process of treating the surfaces of the insulating film 100 and conductive pattern 200 with a reducing plasma. The reducing plasma is a plasma with a treatment gas including, for example, ammonia but may be a plasma with a treatment gas which includes hydrogen.

This embodiment can obtain the same effects as the first embodiment. In addition, in the second surface treating process, the oxide layer 202 formed on the surface layer of the conductive pattern 200 can be reduced in a short time. In addition, in the second surface treating process, even when the relative permittivity of the deterioration layer 102 on the surface layer of the insulating film 100 is further raised, it is possible to prevent the relative permittivity of the surface layer of the insulating film 100 from being raised by modifying the deterioration layer 102 in the first surface treating process.

Figure 5:
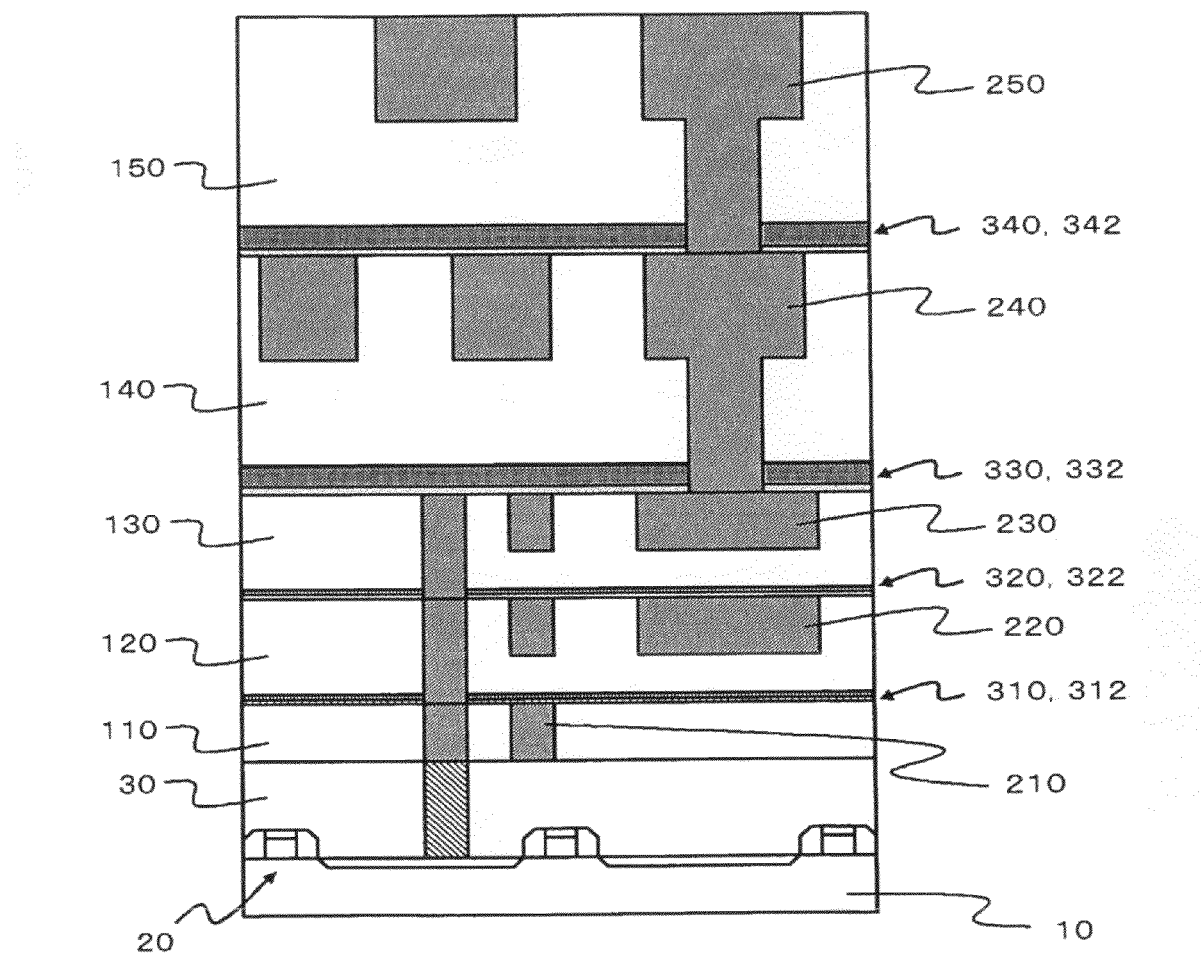
FIG. 5 is a sectional view showing a configuration of a semiconductor device according to a third embodiment.

FIG. 5 is a sectional view showing a configuration of a semiconductor device according to a third embodiment. This semiconductor device has a structure in which an interlayer insulating film 30 and an insulating layer 110 are formed over a substrate 10 on which a transistor 20 is formed and additional insulating layers 120, 130, 140 and 150 are stacked in that order.

The insulating layer 110 is for example a silicon oxide film and may have the same configuration as the insulating film 100 in the first or second embodiment. A conductive pattern 210 is buried in the insulating layer 110. The conductive pattern 210 has the same configuration as the conductive pattern 200 in the first or second embodiment. The conductive pattern 210 is connected to the transistor 20 through, for example, a contact buried in the interlayer insulating film 30.

The insulating layers 120, 130 and 140 have the same configuration as the insulating film 100 in the first or second embodiment and are respectively buried therein with conductive patterns 220, 230 and 240. The conductive patterns 220, 230 and 240 have the same configuration as the conductive pattern 200 in the first or second embodiment and are formed in the same manner as the conductive pattern 200. In addition, a diffusion barrier film (not shown) having the same configuration as the diffusion barrier film 204 in the first embodiment is provided between the conductive patterns 220, 230 and 240 and the insulating layers 120, 130 and 140.

In addition, a CH film 310 and a diffusion barrier film 312 are stacked in this order between the insulating layer 110 and the insulating layer 120. Similarly, a CH film 320 and a diffusion barrier film 322, a CH film 330 and a diffusion barrier film 332, and a CH film 340 and a diffusion barrier film 342 are respectively stacked between the insulating layer 120 and the insulating layer 130, between the insulating layer 130 and the insulating layer 140, and between the insulating layer 140 and the insulating layer 150. These stacked layers have the same configuration as the stacked layers including the CH film 300 and the diffusion barrier film 302 in the first embodiment and are formed in the same manner as the stacked layers including the CH film 300 and the diffusion barrier film 302.

This embodiment can also obtain the same effects as the first or second embodiment.

Although the various embodiments of the present invention have been shown and described above with reference to the drawings, these embodiments are only examples of the present invention which may employ various other configurations. For example, although the CH film 300 is formed between the insulating film 100 and the conductive pattern 200, and the diffusion barrier film 302 in each of the above embodiments, the CH film 300 does not need to be formed.

In addition, in the process shown in FIG. 1B, a nitrogen-containing gas (for example NH3, N2 or the like) may be added to the treatment gas. In this case, instead of the CH film 300, a CHN film is formed on the surface of the insulating film 100 and the surface of the conductive pattern 200. In this case, the same effects as above can also be obtained. In addition, since a breakdown voltage of the CHN film is higher than that of the CH film 300, the breakdown voltage between upper and lower interconnects is raised.

It is apparent that the present invention is not limited to the above embodiments, but may be modified and changed without departing from the scope and spirit of the invention.

What is claimed is:

1. A method of manufacturing a semiconductor device, comprising:
   burying a conductive pattern in an insulating film made of SiOH, SiCOH or organic polymer;
   treating surfaces of said insulating film and said conductive pattern with plasma which includes a hydrocarbon gas as a treatment gas; and
   forming a diffusion barrier film, which is formed of an SiCH film, an SiCHN film, an SiCHO film or an SiCHON film, over said insulating film and said conductive pattern by performing a plasma CVD by adding a Si-containing gas to said treatment gas while increasing the addition amount gradually or in a step-by-step manner.

2. The method as set forth in claim 1, wherein said insulating film comprises a porous film including a plurality of holes.

3. The method as set forth in claim 1,
   wherein a relative permittivity of said insulating film is equal to or less than 2.7.

4. The method as set forth in claim 1,
   wherein said treating surfaces of said insulating film and said conductive pattern includes forming a CH film or a CHN film on said surfaces of said insulating film and said conductive pattern.

5. The method as set forth in claim 4,
   wherein said forming a diffusion barrier film includes forming said diffusion barrier film to be continued to said CH film or said CHN film.

6. The method as set forth in claim 5,
   wherein said forming diffusion barrier film is performed by starting the addition of said Si-containing gas while said plasma being maintained in said treating surfaces of said insulating film and said conductive pattern.

7. The method as set forth in claim 1,
   wherein said diffusion barrier film includes an Si concentration which increases in an upward direction gradually or in a step-by-step manner.

8. The method as set forth in claim 1, further comprising between said burying a conductive pattern in an insulating film and said treating surfaces of said insulating film and said conductive pattern:
   retreating said surfaces of said insulating film and said conductive pattern with a reducing plasma.

* * * * *